United States Patent
Leussler et al.

(10) Patent No.: US 12,392,849 B2
(45) Date of Patent: Aug. 19, 2025

(54) CABLE HARNESS WITH MULTIPLE RF CHOKES AND MAGNETIC RESONANCE SYSTEM

(71) Applicant: KONINKLIJKE PHILIPS N.V., Eindhoven (NL)

(72) Inventors: Christoph Günther Leussler, Hamburg (DE); Christian Findeklee, Norderstedt (DE)

(73) Assignee: Koninklijke Philips N.V., Eindhoven (NL)

( * ) Notice: Subject to any disclaimer, the term of this patent is extended or adjusted under 35 U.S.C. 154(b) by 58 days.

(21) Appl. No.: 18/276,306

(22) PCT Filed: Feb. 23, 2022

(86) PCT No.: PCT/EP2022/054470
§ 371 (c)(1),
(2) Date: Aug. 8, 2023

(87) PCT Pub. No.: WO2022/184515
PCT Pub. Date: Sep. 9, 2022

(65) Prior Publication Data
US 2024/0302464 A1    Sep. 12, 2024

(30) Foreign Application Priority Data

Mar. 4, 2021 (EP) ..................... 21160612

(51) Int. Cl.
*G01R 33/36* (2006.01)
(52) U.S. Cl.
CPC .......... *G01R 33/3685* (2013.01); *G01R 33/36* (2013.01)

(58) Field of Classification Search
CPC .......................... G01R 33/36; G01R 33/3685
See application file for complete search history.

(56) References Cited

U.S. PATENT DOCUMENTS

| 4,682,125 A | * | 7/1987 | Harrison | ............ | G01R 33/3685 |
| | | | | | 324/318 |
| 5,543,713 A | | 8/1996 | Arakawa et al. | | |

(Continued)

FOREIGN PATENT DOCUMENTS

| WO | 2015150507 A1 | 10/2015 |
| WO | 2018077679 A1 | 5/2018 |

(Continued)

OTHER PUBLICATIONS

International Search Report and Written Opinion from PCT/EP2022/054470 mailed May 16, 2022.

(Continued)

*Primary Examiner* — Steven L Yeninas

(57) ABSTRACT

According to the invention, a cable harness (7) for a magnetic resonance system is provided, wherein the cable harness (7) is adapted for being connected to a feeding point of a magnetic resonance radiofrequency coil device (1) on one end and for being connected to an input-output unit (6) for connecting the magnetic resonance radiofrequency coil device (1) with a control and analysis unit of the magnetic resonance system on the other end, wherein the cable harness (7) comprises at least one transmission line (8) for connecting the feeding point with the input-output unit (6) and multiple radiofrequency chokes (10) which are arranged within the cable harness (7). In this way, a bulky resonant RF traps can be avoided while still the B1-excitation field of the MR system can be compensated for and coupling to local nearby coils can be reduced.

20 Claims, 7 Drawing Sheets

(56) References Cited

U.S. PATENT DOCUMENTS

| | | | |
|---|---|---|---|
| 2003/0094950 A1 | 5/2003 | Burl | |
| 2006/0252314 A1 | 11/2006 | Atalar et al. | |
| 2011/0267061 A1* | 11/2011 | Taracila | G01R 33/3685 |
| | | | 324/322 |
| 2015/0008926 A1 | 1/2015 | Yang et al. | |
| 2016/0356868 A1 | 12/2016 | Stormont et al. | |
| 2018/0003783 A1* | 1/2018 | Tomiha | G01R 33/50 |
| 2019/0310329 A1 | 10/2019 | Malik et al. | |
| 2020/0233048 A1 | 7/2020 | Corea | |
| 2020/0348380 A1* | 11/2020 | Taracila | G01R 33/34007 |

FOREIGN PATENT DOCUMENTS

| | | |
|---|---|---|
| WO | 2018098331 A1 | 5/2018 |
| WO | 2019103988 A1 | 4/2019 |

OTHER PUBLICATIONS

Darl Kuhn "Tunable Rsonator Design for Safe Digital LVDS Cable Routing ED" IP.com, Feb. 22, 2021.

* cited by examiner

CABLE HARNESS WITH MULTIPLE RF CHOKES AND MAGNETIC RESONANCE SYSTEM

CROSS REFERENCE TO RELATED APPLICATIONS

This application is a U.S. national phase Applications of International Application No. PCT/EP2022/054470 filed on Feb. 23, 2022, which claims the benefit of EP Application Serial No. 21160612.4 filed on Mar. 6, 2021 and is incorporated herein by reference.

FIELD OF THE INVENTION

The invention relates to the field of magnetic resonance (MR) systems, and in particular to a cable harness to and a magnetic resonance coil device.

BACKGROUND OF THE INVENTION

For magnetic resonance systems and especially for magnetic resonance imaging (MRI) systems, efforts are continuously being made to increase the number of radiofrequency (RF) receive coils that are used in order to increase the speed of image acquisition. It is not uncommon to have up to sixty-four RF receive coils in a magnetic resonance coil array. The RF receive coils are typically connected by a coaxial cable to an RF receiver that samples and digitizes the received RF signal. Due to these increases in RF channel count, MRI system designers are under continuous pressure to reduce the sizes of components and sub-assemblies that are employed with the RF receive coils.

Magnetic resonance imaging (MRI) is an imaging technology that is based on the principles of nuclear magnetic resonance, i.e. that atomic nuclei with non-zero spin have a magnetic moment. In medical MRI, the atomic nuclei with non-zero spin is usually the nuclei of hydrogen atoms, which are present in the human or animal body. Radio frequency (RF) waves forming a B1-excitation field, are directed at the nuclei in an external magnetic field, leading to an excitation of the protons and a subsequent relaxing process of the protons. Relaxation of the protons, results in RF signals being emitted by the nuclei that can be detected and processed to form an image.

A typical MRI system generally comprises a magnet, for example a superconducting electromagnet, that generates a strong static magnetic field, gradient coils that generate linear variations in the static magnetic field, RF transmit coils that generate the B1-excitation field, and RF receive coils that detect the magnetic resonance RF signal emitted by the relaxing nuclei. Typically, coaxial cables are used in MRI systems for the controlled transmission of RF signals within the coils. A coaxial cable has an outer shield and an inner conductor that are separated from one another by a dielectric material. The outer shield has the aim to protect the inner conductor from picking up undesired frequencies.

However, sources external to the coaxial cable can induce unintended electrical currents in the outer shield and thus generate unintended magnetic fields that influence the signal to noise ratio of the RF receive coil array adversely. For these reasons, RF traps, such as Baluns or RF chokes, are used with coaxial cables in MR systems.

Typically, multiple RF receive coils are used in MR systems forming a receive coil array. Traditional RF receive coils and RF receive coil arrays tend to be bulky and/or rigid and are configured to be maintained at a fixed position relative to other RF receive coils in the coil array and relative to the imaging subject, respectively. The bulkiness and lack of flexibility often prevents the RF receive coils from coupling most efficiently with the desired anatomy of the imaging subject and tends to make the imaging process uncomfortable to the imaging subject.

By increasing the number of RF receive coils in the coil array the time for image acquisition can be reduced. However, the increasing number of RF receive coils calls for the need to miniaturize the components that are employed with the RF receive coils, i.e. RF cables, RF traps such as RF chokes, preamplifiers, and printed circuit boards (PCB). Along with the goal to miniaturize RF receive coil arrays, the RF receive coils and the electronics come closer to the imaging subject, compared with traditional RF receive coils, rendering the form, size and weight of the receive coils and coil electronics becomes even more important for the experience of the imaging subject and the handling experience of the operator. However, due to the rugged environment for MRI systems in hospitals the RF receive coils and components still need to be designed robustly so that the systems survive daily clinical routine.

WO 2018/077679 A1 provides a balun that is suitable for use with miniature coaxial cables and that obviates the need to cut the cable in order to install the balun. A portion of each coaxial cable that extends from the RF receive coils to an RF receiver is wound multiple times around a device to form an inductor.

SUMMARY OF THE INVENTION

It is an object of the invention to provide a possibility for a RF receive coil device for a MR system which avoids bulky resonant RF traps while still the B1-excitation field of the MR system can be compensated for and coupling to local nearby coils can be reduced.

According to the invention, this object is addressed by the subject matter of the claim 1. Preferred embodiments of the invention are described in the sub claims.

Therefore, according to the invention, a cable harness for a magnetic resonance system is provided, wherein the cable harness is adapted for being connected to a feeding point of a magnetic resonance radiofrequency coil device on one end and for being connected to an input-output unit for connecting the magnetic resonance radiofrequency coil device with a control and analysis unit of the magnetic resonance system on the other end, wherein the cable harness comprises at least one transmission line for connecting the feeding point with the input-output unit and multiple radiofrequency chokes which are arranged within the cable harness.

As explained further above, it is important to miniaturize the components that are employed with the RF receive coils. The RF receive coils and the electronics come closer to the imaging subject compared with traditional RF receive coils. To improve the experience of the imaging subject and the handling experience of the operator by avoiding heavy and staff equipment, the RF receive coils can be arranged in a flexible structure, i.e, a mat, that lies on the imaging subject during examination. Typically, the radiofrequency chokes are arranged within this coil array of a magnetic resonance radiofrequency coil device as well. In order to improve the flexibility of the equipment that is lying on the imaging subject during examination, according to the present invention, though radiofrequency chokes may still be arranged within the coil array, a cable harness with such RF chokes is provided which is adapted for being connected to a feeding point of a magnetic resonance radiofrequency coil device on one end and for being connected to an input-output unit for connecting the magnetic resonance radiofrequency coil device with a control and analysis unit of the magnetic resonance system on the other end. Therefore, the invention at least offers the possibility of arranging individual RF chokes for the different RF receive coils outside the array, i.e. in the cable harness.

In this way, bulky resonant RF traps can be avoided while still the B1-excitation field of the MR system can be compensated for and coupling to local nearby coils can be reduced.

According to a preferred embodiment of the invention, the cable harness comprises multiple transmission lines for connecting the feeding point with the input-output unit, wherein the transmission lines each comprises at least one radiofrequency choke which is arranged within the cable harness.

According to a preferred embodiment of the invention, the radiofrequency chokes are arranged in the cable harness in an arrangement which extends along the longitudinal extension of the cable harness. The longitudinal extension of the cable harness is the extension of the cable harness from the connection terminal to the input-output unit. In case of a flexible cable harness this longitudinal does not have to follow a straight line.

According to a preferred embodiment of the invention, the radiofrequency chokes are arranged in the cable harness in series one after the other. By arranging the individual microtraps in such a line, a relatively thin trap can be realized, and in this way, a relatively thin cable harness can be realized.

According to a preferred embodiment of the invention, the radiofrequency chokes each comprise a choke housing, wherein the cable harness comprises multiple transmission lines which are coaxial cables and which are wound around the choke housing in a self-compensated winding pattern for at least partially compensating a B1-excitation field of the magnetic resonance system. The coaxial cable has a first end and a second end, wherein a portion of the coaxial cable in between the first end and the second end is wounded around the choke housing in a self-compensated winding pattern. Radiofrequency chokes having such a self-compensated winding pattern are also called a self-compensated RF choke. The self-compensated winding pattern provides compensation for the B1-excitation field of the MR system and eliminates coupling to local nearby coils. In this way, the self-compensated winding pattern may help for the behavior of the self-compensated RF choke as an ideal inductor. Due to the stray capacitance of the self-compensated winding pattern, the self-compensated RF choke is self-resonant at a self-resonant frequency. Generally, the self-resonant frequency of an inductor is the frequency at which the stray capacitance of the inductor resonates with the ideal inductance of the inductor, resulting in a very high impedance. Thus, the self-resonance of the self-compensated RF choke helps to increase the impedance of the self-compensated RF choke. The self-resonant frequency of the self-compensated RF choke typically depends on the specific geometry of the choke housing, the self-compensated winding pattern and a diameter of the coaxial cable. According to a preferred embodiment of the invention, the choke housing is realized on a flexible PCB structure. Further, according to a preferred embodiment of the invention, the housing is realized using a flexible housing manufactured by an ink jet printer. Furthermore, according the invention, the cable harness may have change in diameter and width. Even if the self-resonant frequency is not at the same frequency or close to the frequency of the B1-excitation field of the MRI system, the self-compensated RF choke still provides a sufficiently high impedance. Thus, signal to noise ratio of the MRI system is improved without the need to design the RF choke to have a resonant frequency that is equal or close to the B1-excitation field as necessary for conventional resonant RF traps. According to a preferred embodiment of the invention, individual RF chokes are tuned to different frequencies. e.g. one RF choke to 1.5 Tesla and another RF choke to 3 Tesla which allows for using the cable harness for both field strengths.

According to a preferred embodiment of the invention, the transmission lines each comprise a pair of a first coaxial cable and a second coaxial cable, wherein the first coaxial cable and the second coaxial cable are provided with an additional shield which is surrounding the first coaxial cable and the second coaxial cable and/or the first coaxial cable and the second coaxial cable are twisted around each other to form a twisted transmission line. Preferably, the first coaxial cable and the second coaxial cable each have an impedance of 50Ω. By using twice a standard 50Ω cable, the impedance resulting for the signal between the inner conductors is given by 100Ω, thus, fitting well to the standards defined for most serial digital data transmission lines. Preferably, the first coaxial cable and the second coaxial cable are micro coaxial cables. Preferably, the micro coaxial cables have an outer diameter of 0.2 to 1.0 mm. Such coaxial lines should be preferably chosen by very thin types in order to get a flexible cable. The two cables can be of the same but also of different types. Preferably, a capacitor is arranged at both ends of each transmission line. Therefore, capacitors can be used to connect the two outer shields of the micro coaxial cables at least at the ends of the transmission line but also in-between. A further preferred embodiment is a thin triaxial cable using shorted quarter wave line of the outer conductor and wound as a choked toroid. According to a preferred embodiment of the invention, at least one twin-axial RF cable is used or a combination of a twin-axial cable and a coaxial cable or any other combination thereof.

According to a preferred embodiment of the invention, the chokes each comprise a choke housing which is made of a flexible foam material and/or a liquid-based material. Therefore, the flexible trap is realized by using a flexible foam or another garment matrix housing. The foam housing is built with local for the individual traps. A different mechanical design is the realisation of a liquid based flexible housing of the trap.

According to a preferred embodiment of the invention, the cable harness comprises a flexible support structure, and the RF chokes are arranged in the flexible support structure. The flexible structure allows to bend the cable harness which makes the positioning of a magnetic resonance radiofrequency coil device possibly connected to the bendable cable harness more flexible. According to a preferred embodiment of the invention, the harness comprises, at least partially, a stretchable housing and mechanical matrix material.

According to a preferred embodiment of the invention, the RF chokes are flexibly connected to the support structure such that the RF chokes are rotatable and/or inclinable with respect to the support structure. In this way, a flexible cable harness may be provided that allows for the self-compensated RF chokes to be positioned more arbitrarily, allowing placement to be based on the specific situation. Preferably the fixation of the self-compensated RF chokes allows rotation and/or angulation of the self-compensated RF chokes for +/−30 degrees with respect to the support structure.

According to a preferred embodiment of the invention, the RF chokes each comprise a shielding, and the shieldings are each arranged in proximity to the respective transmission line of the radio frequency choke and/or between two adjacent radio frequency chokes. In this way, crosstalk can be reduced. This design provides also trapping of differential modes between the individual transmission lines.

According to a preferred embodiment of the invention, the choke housings have a toroid shape, a solenoid shape, a helical shape or a planar shape. Preferably, the choke housing of a toroidal choke has a diameter of about 11 mm and a thickness of 6 mm. Solenoidal designs preferably have a diameter of 3 to 6 mm.

Further, according to the invention, a cable harness of any of the previous claims is used for connecting a feeding point of a magnetic resonance radiofrequency coil device to an input-output unit of a magnetic resonance radiofrequency coil device, the input-output unit being used for connecting the magnetic resonance radiofrequency coil device to a control and analysis unit of a magnetic resonance system.

Further, according to the invention, a magnetic resonance coil device for a magnetic resonance system is provided, comprising an array with multiple magnetic resonance receive coils which are configured for receiving a magnetic resonance radiofrequency signal, multiple individual connection lines and a connection terminal, wherein each of the magnetic resonance receive coils is connected to the connection terminal with one of the connection lines for transmitting the magnetic resonance radiofrequency signals to the connection terminal, an input-output unit, and a cable harness with multiple transmission lines which on one side are individually connected to a respective connection line via the connection terminal and on the other side are connected to the input-output unit for transmitting the individual magnetic resonance radiofrequency signals to an analysis and control unit of the magnetic resonance system via the input-output unit, wherein the transmission lines each comprise at least one radiofrequency choke which is arranged within the cable harness. The connection terminal is the feeding point of the receive coil array. In this way, a cluster of individual high impedance chokes may be provided at/right after the feeding point, and a bulky RF trap is avoided. Therefore, a flexible trap may be achieved since the individual RF chokes are arranged within the flexible cable harness. A distributed flexible RF trap may be employed to trap the output line of the RF antennae array.

Therefore, it is part of the invention to use a cluster of individual RF chokes for each resonance receive coil wherein the RF chokes are arranged within the cable harness which connects the feeding point of the magnetic resonance receive coil array with the input-output unit. In this way, the RF chokes which are arranged in the cable harness allow to replace conventional bulky resonant RF traps used in conventional receive coil arrays and hence allow implementing a distributed cable routing in an easy and efficient way, wherein each RF receive coil is connected to the input-output unit by an individual line comprising at least one individual RF choke. In contrast to conventional cable routings, where the coaxial cables are routed along a fishbone structure and where the parallel routing of the coaxial cables lead to thick and inflexible cable bundles and large RF traps, the distributed cable routing of the invention together with the arrangement of the RF chokes in the cable harness makes it possible that the complete magnetic resonance coil device can be flexible which increases both patient and operator experience.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

The flexible cable harness according to the invention especially adds value to magnetic resonance coil device with a coil array, and especially to a coil array which is also flexible. Therefore, while the flexible cable harness may be used with different types of coil arrangements, in the following, preferred embodiments of the invention are described with respect to such a magnetic resonance coil device with a flexible coil array.

Figure 1:
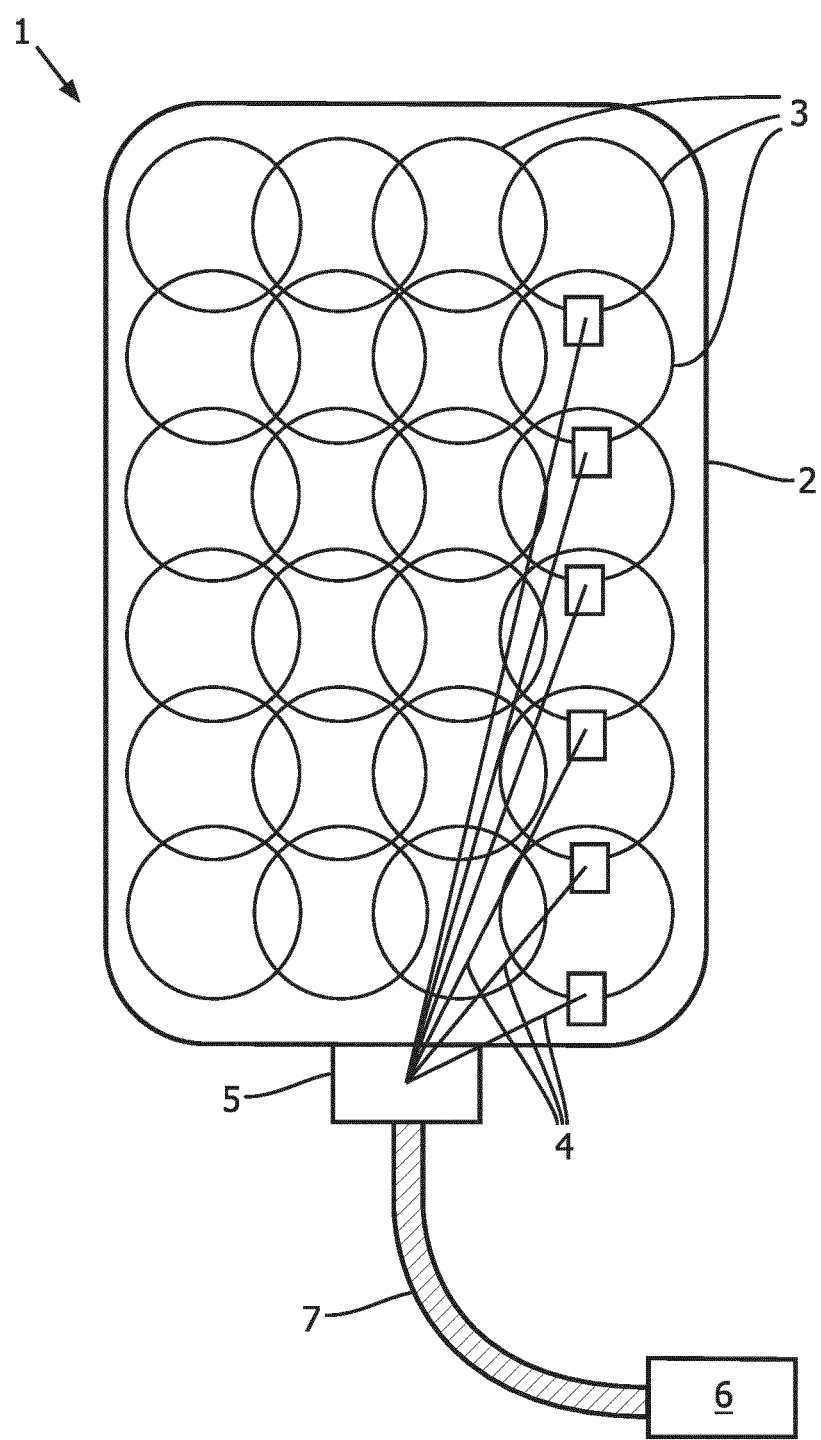
FIG. 1 schematically depicts a magnetic resonance coil device with a cable harness according to a preferred embodiment of the invention.
Figure 4:
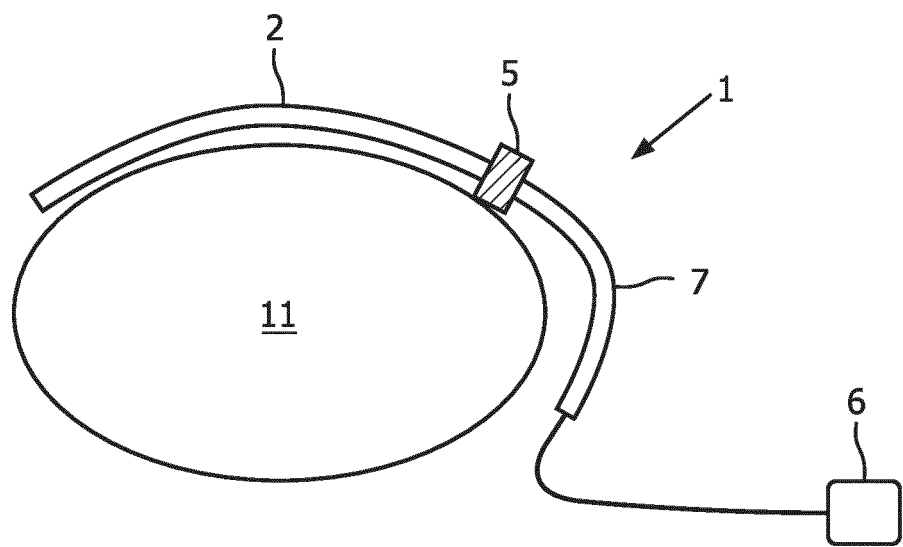
FIG. 4 schematically depicts how the magnetic resonance coil device of FIG. 1 may be arranged on an object under examination.

FIG. 1 schematically depicts a magnetic resonance coil device 1 with a cable harness 7 according to a preferred embodiment of the invention. The magnetic resonance coil device 1 comprises a magnetic resonance coil array 2 which comprises multiple RF receive coils 3, that are arranged as two-dimensional array. Each of the RF receive coils 3 is connected to a connection terminal 5 via connection lines 4. Hence, the connection terminal 5 of the magnetic resonance coil array 2 is the feeding point of the magnetic resonance radiofrequency coil device 1. Though all RF receive coils 3 are connected to such a connection line 4, for the sake of clarity, only six such connection lines 4 are shown in FIG. 4. The individual connection lines 4 connect the RF receive coils 3 with the connection terminal 5 for transmitting the magnetic resonance radiofrequency signals to the connection terminal 5 in a direct manner, meaning that the connection lines 4 are not bundled together to form cable bundles in an area defined by the two-dimensional array of the multiple RF receive coils 2. The connection lines 4 do not comprise a self-compensated RF choke 10. The receive coils 3 are arranged homogeneously over the area defined by the two-dimensional array 2. The connection terminal 5 may be connected with a control and analysis unit of a magnetic resonance system via the cable harness 7. Thereby, the cable harness 7 may be connected with the connection terminal 5 on one end and with an input-output unit 6 of the control and analysis unit on the other end. The magnetic resonance coil array 2 and the cable harness 7 each comprise a flexible support structure 9.

In this embodiment the magnetic resonance receive coil device 1 is used as a receive coil array 2 of a magnetic resonance imaging system, having a B1-exicitation field.

Figure 2:
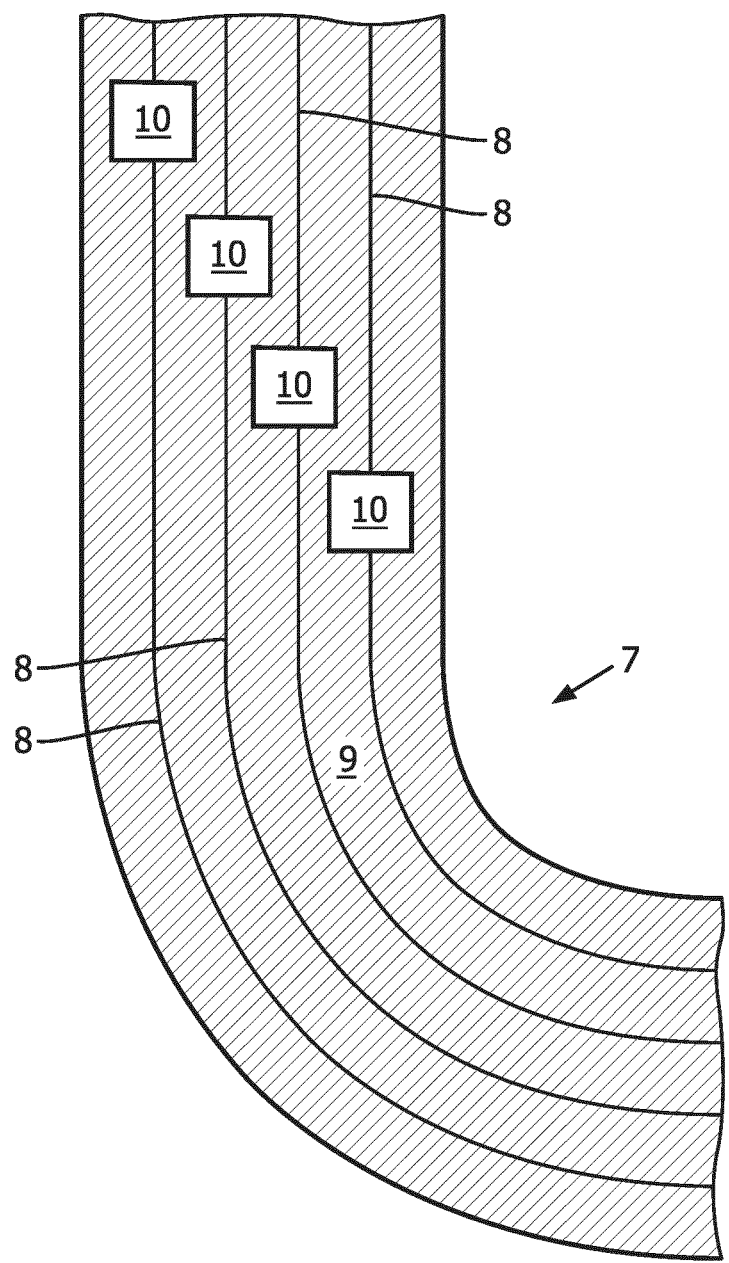
FIG. 2 schematically depicts the harness of the magnetic resonance coil device of FIG. 1.

FIG. 2 schematically depicts the cable harness 7 of the magnetic resonance coil device 1 of FIG. 1. The cable harness 7 comprises multiple transmission lines 8, wherein each transmission line 8 comprises a RF choke. Though the number of transmission lines 8 equals the number of RF receive coils 3 of the magnetic resonance coil array 2, for the sake of clarity, only five such transmission lines 8 are shown in FIG. 2. The transmission lines 8 connect the connection terminal 5 with the input-output unit 6. The RF chokes 10 are arranged one after the other along the longitudinal axis of the cable harness 7. Thus, the width of the cable harness (orthogonal to the longitudinal axis) can be kept relatively small. The RF chokes 10 are flexibly arranged in and connected to the support structure 9 so that the RF chokes are rotatable and/or inclinable with respect to the support structure 9. This causes a completely flexible and bendable cable harness 7.

Figure 3:
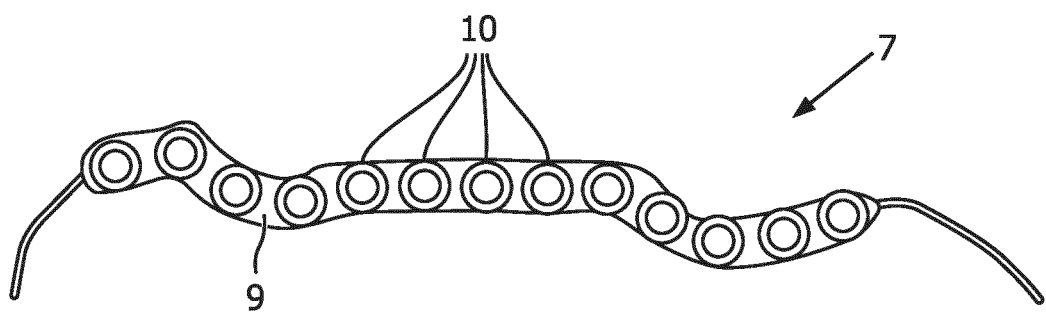
FIG. 3 schematically depicts the arrangement of RF chokes in the cable harness of FIG. 2 in series one after the other.

FIG. 3 schematically depicts the arrangement of RF chokes 10 in the cable harness 7 of FIG. 2 in series one after the other. Instead of a typically large bulky trap, a relatively thin trap can be realized by arranging the individual microtraps in such a line. Therefore a relatively thin and bendable cable harness 7 can be realized. To reduce crosstalk, individual RF traps 10 can be shielded or a shield between the RF traps 10 can be positioned as an option (not shown in FIG. 3). This design provides also trapping of differential modes between the individual transmission lines.

FIG. 4 schematically depicts how the magnetic resonance coil device 1 of FIG. 1 may be arranged on an object under examination 11. The array with multiple receive coils 2 is lying on and object under examination 11. The array 2 is flexible so that its form can be adapted to the shape of the object under examination 11. The flexible and bendable cable harness 7 enables a flexible positioning of the array 2 on the object under examination 11 relative to the input-output unit 6. For example, the lateral alignment of the receive coil array 2 or a possible rotation of the receive coil array 2 does not have to be taken into account during positioning, because the connection between the receive coil array 2, respectively the connection terminal 5 and the usually permanently installed input-output unit 6 via the bendable cable harness 7 is flexible.

Figure 5:
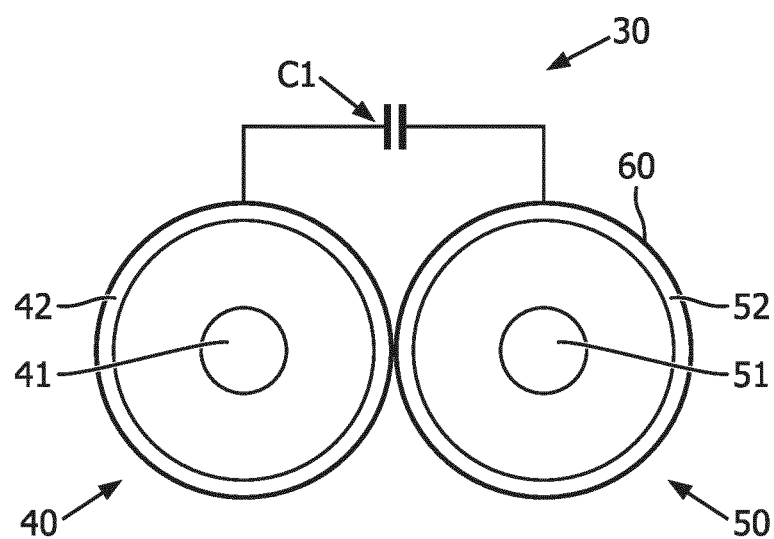
FIG. 5 schematically depicts a transmission line according to a preferred embodiment of the invention.

FIG. 5 schematically depicts a transmission line 30 according to a preferred embodiment of the invention in a cross-sectional view. The transmission line 30 comprises a first coaxial cable 40 and a second coaxial cable 50. The first coaxial cable 40 comprises a first inner conductor 41 and a first outer conductor 42. The second coaxial cable 50 comprises a second inner conductor 51 and a second outer conductor 52. Both coaxial cables 40, 50 are galvanically insulated to the outside by the sheathing insulation 60. The first outer conductor 42 and the second outer conductor 52 are connected with each other via a capacitor C1.

Figure 6:
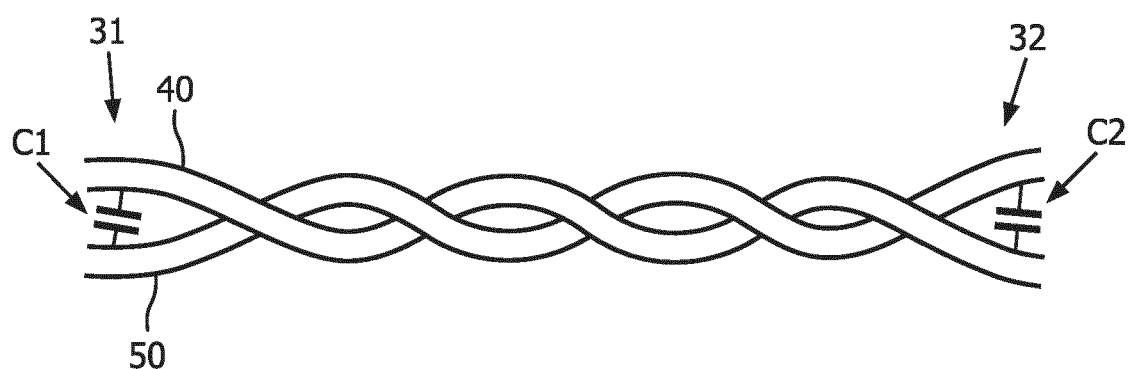
FIG. 6 schematically depicts a transmission line according to another preferred embodiment of the invention.

FIG. 6 schematically depicts a transmission line which is similar to the one of FIG. 5 in a perspective view. The first coaxial cable 40 and the second coaxial cable 50 are also twisted around each other. Here, both ends of the transmission line 31, 32 are connected to each other via a respective capacitor C1, C2.

Figure 7A:
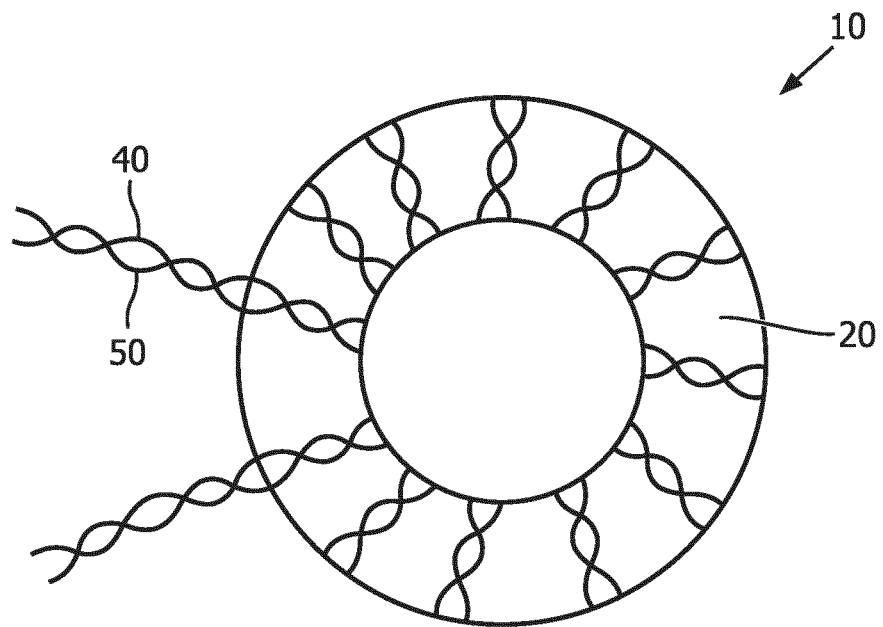
FIG. 7a schematically depicts a RF choke according to a preferred embodiment of the invention in a top view.

FIG. 7a schematically depicts a RF choke 10 according to a preferred embodiment of the invention in a top view. The RF choke 10 comprises a choke housing 20. In this embodiment, the choke housing 20 comprises a toroidal form. The transmission line comprising a first coaxial cable 40 and a second coaxial cable 50 that are twisted around each other, as shown in FIG. 6, is wound around the choke housing 20. The twisted coaxial cables 40, 50 are wound around the surface of the choke housing 20. A single winding is formed by the coaxial cables 40, 50 running from the outside of the choke housing 20 through the whole in the middle, back to the outside of the choke housing 20.

Figure 7B:
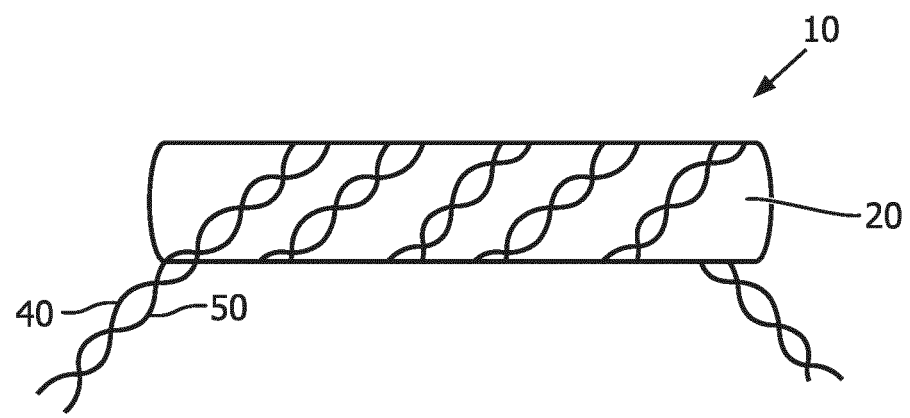
FIG. 7b schematically depicts another RF choke according to a preferred embodiment of the invention in a top view.

FIG. 7b schematically depicts another RF choke 10 according to a preferred embodiment of the invention in a top view. In this embodiment, the RF choke 10 comprises a solenoid form. The transmission line comprising a first coaxial cable 40 and a second coaxial cable 50 that are twisted around each other, as shown in FIG. 6, is wound around the choke housing 20. The transmission line is wound helically around the surface of the choke housing 20.

Figure 8A:
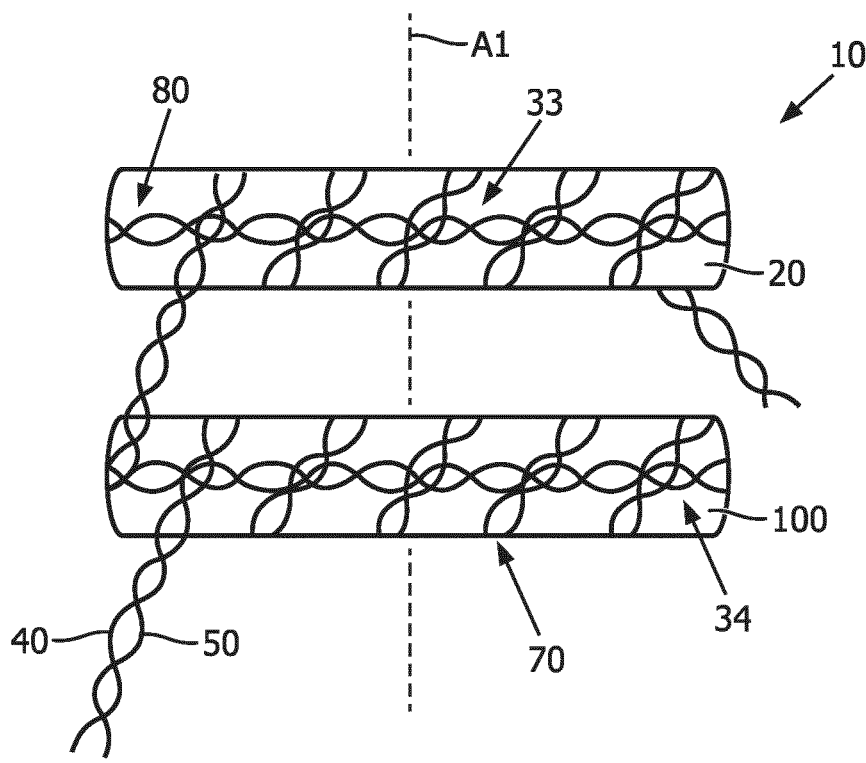
FIG. 8a schematically depicts a RF choke according to another preferred embodiment of the invention in a side view.

FIG. 8a schematically depicts a RF choke 10 according to another preferred embodiment of the invention in a side view. The RF choke 10 comprises two choke housings 20, 100. The transmission line comprising a first coaxial cable 40 and a second coaxial cable 50 is first wound around the first choke housing 20 in a plane comprising the axis of revolution A1, second wound around the first choke housing 20 in a plane perpendicular to the axis of revolution A1 of the toroidal form and along an outer circumference of the toroidal form, third wound around the additional choke housing 100 in a plane comprising the axis of revolution A1 and fourth wound around the additional choke housing 100 in a plane perpendicular to the axis of revolution A1 of the toroidal form and along an outer circumference of the toroidal form. Both choke housings 20, 100 are connected via the same twisted and wounded coaxial cables 40, 50.

Figure 8B:
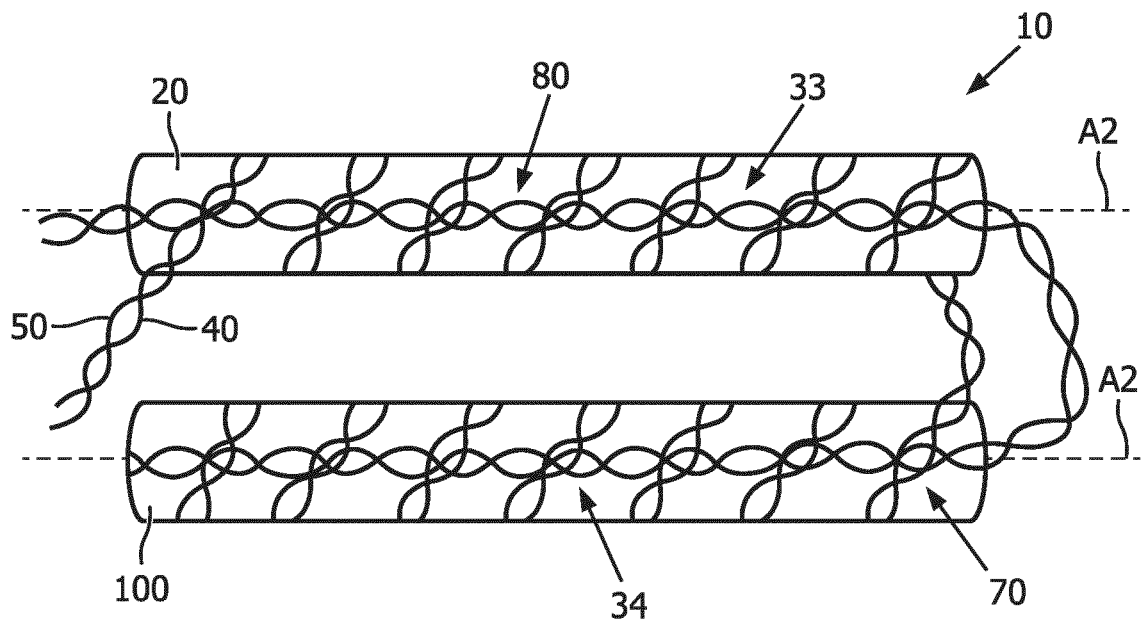
FIG. 8b schematically depicts another RF choke according to another preferred embodiment of the invention in a top view.

FIG. 8b schematically depicts another RF choke 10 according to another preferred embodiment of the invention in a top view. The RF choke 10 comprises two choke housings 20, 100. The transmission line comprising a first coaxial cable 40 and a second coaxial cable 50 is first wound around the first choke housing 20 in a plane perpendicular to the axis of revolution A2 of the choke housing 20, second wound around the first choke housing 20 in a plane comprising the axis of revolution A2 of the choke housing 20 and along an outer circumference of the choke housing 20, third wound around the additional choke housing 100 in a plane perpendicular to the axis of revolution A2 of the choke housing 20 and fourth wound around the additional choke housing 100 in in a plane comprising the axis of revolution A2 of the choke housing 100 and along an outer circumference of the choke housing 100. Both choke housings 20, 100 are connected via the same twisted and wounded coaxial cables 40, 50.

FIGS. 7a to 8b show embodiments of options for high impedance chokes 10 using twisted coaxial cables 40, 50. The designs can also be realized using shielded or partly shielded twisted coaxial cables 40, 50. Individual conductors are realized using CuL (CC1101 USB Lite) wire, twisted coaxial cables and/or isolated wires.

Figure 9A:
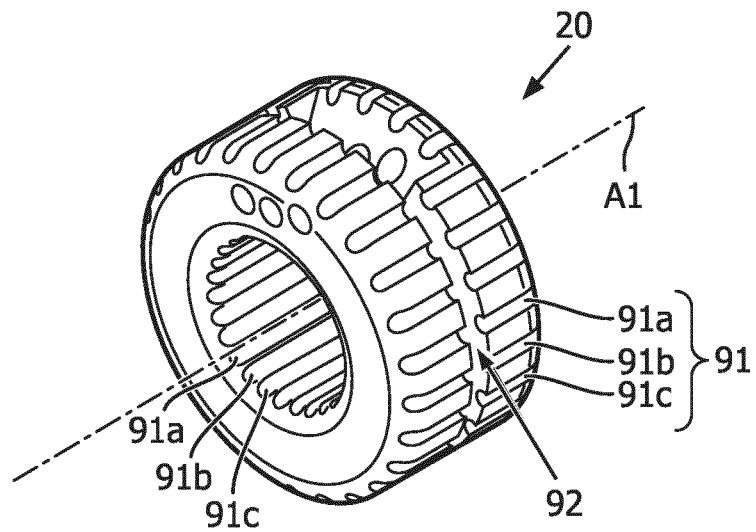
FIG. 9a depicts a choke housing according to a preferred embodiment of the invention in a perspective view.

FIG. 9a schematically depicts the choke housing 20 of the self-compensated RF choke 10 according to preferred embodiment of the invention as indicated in FIG. 7a in a perspective view. The choke housing 20 has a toroidal form. As already mentioned, the transmission line 30 is wound around the choke housing 30 in a self-compensated winding pattern as shown in FIG. 7a. In order to guide the winding of the transmission line 30 around the choke housing 20, the choke housing 20 comprises a first cut out structure 91 and a second cut out structure 92. The first cut out structure 91 comprises multiple cut outs 91a, 91b, 91c for guiding a first winding pattern of the self-compensated winding pattern, wherein each cut out 91a, 91b, 91c is located in a plane comprising the axis A1 of the toroidal form. With regard to the second cut out structure 92, the second cut out structure 92 comprises a further cut out 92 for guiding a counter winding pattern of the self-compensated winding pattern, wherein the further cut out 92 is located in a plane perpendicular to the axis A1 of the toroidal form and along an outer circumference of the toroidal form.

Figure 9B:
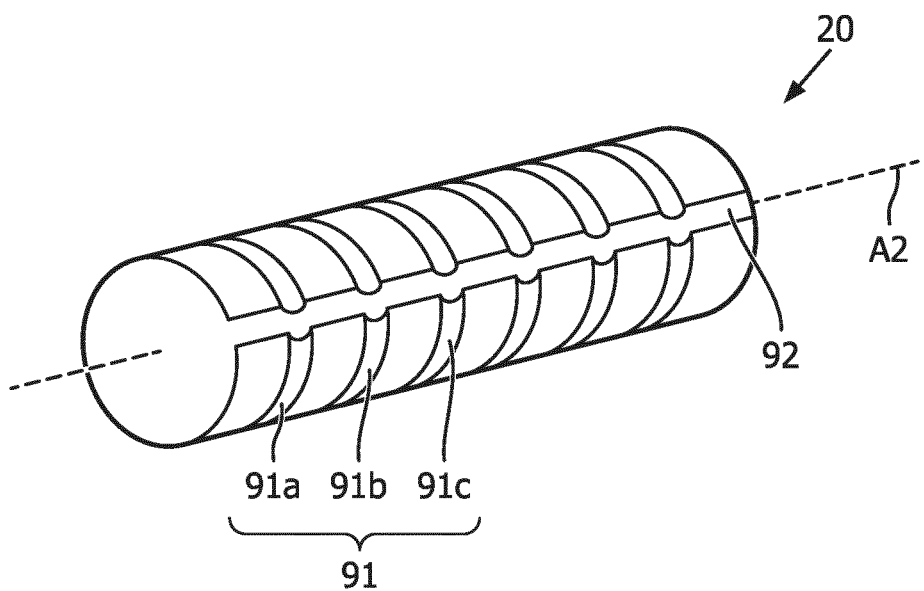
FIG. 9b depicts a choke housing according to a preferred embodiment of the invention in a perspective view.

FIG. 9b schematically depicts another choke housing 20 of the self-compensated RF choke 10 according to preferred embodiment of the invention as indicated in FIG. 7b in a perspective view. The choke housing 20 has a cylindrical form. The transmission line 30 is wound around the choke housing 20 in a solenoid-shaped and self-compensated winding pattern as shown in FIG. 7b. In order to guide the winding of the transmission line 30 around the choke housing 20, the choke housing 20 comprises a first cut out structure 91 and a second cut out structure 92. The first cut out structure 91 comprises multiple cut outs 91a, 91b, 91c for guiding a first winding pattern of the self-compensated winding pattern, wherein each cut out 91a, 91b, 91c is located in a plane perpendicular to the axis A2 of the choke housing 20. With regard to the second cut out structure 92, the second cut out structure 92 comprises a further cut out 92 for guiding a counter winding pattern of the self-compensated winding pattern, wherein the further cut out 92 is located in a plane comprising the axis A2 of the choke housing 20 and along an outer circumference of the choke housing 20.

While the invention has been illustrated and described in detail in the drawings and foregoing description, such illustration and description are to be considered illustrative or exemplary and not restrictive: the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST magnetic resonance receive coil device 1
array with multiple receive coils 2
connection lines 4
receive coils 3
connection terminal 5
input-output unit 6
cable harness 7
transmission lines 8
flexible support structure 9
RF chokes 10
object under examination 11
choke housing 20
transmission line 30
first end 31
second end 32
first subsection 33
second subsection 34
first coaxial cable 40
first inner conductor 41
first outer conductor 42
second coaxial cable 50
second inner conductor 51
second outer conductor 52
shielding 60
first winding pattern 70
counter winding pattern 80
first cut out structure 91
second cut out structure 92
additional choke housing 100
axis A1
axis A2
capacitor C1
capacitor C2

The invention claimed is:

1. A cable harness for a magnetic resonance system, wherein the cable harness is configured to connect to a feeding point of a magnetic resonance radiofrequency coil device on one end and configured to be connected to an input-output unit to connect the magnetic resonance radiofrequency coil device with a control and analysis unit of the magnetic resonance system on the other end, wherein the cable harness comprises; at least one transmission line for connecting the feeding point with the input-output unit, wherein the cable harness comprises: a flexible support structure and multiple radiofrequency chokes within the cable harness in the flexible support structure and the radiofrequency chokes—are flexibly connected to the support structure such that the radiofrequency chokes are rotatable and/or inclinable with respect to the support structure.

2. The cable harness of claim 1, wherein the cable harness comprises multiple transmission lines for connecting the feeding point with the input-output unit, wherein the transmission lines each comprise at least one radiofrequency choke which is arranged within the cable harness.

3. The cable harness of claim 1, wherein the radiofrequency chokes are arranged in the cable harness in an arrangement which extends along the longitudinal extension of the cable harness.

4. The cable harness of claim 3, wherein the radiofrequency chokes—are arranged in the cable harness in series one after the other.

5. The cable harness of claim 1, wherein the radiofrequency chokes each comprise a choke housing, and wherein the cable harness comprises multiple transmission lines which are micro-coax cables and are wound around the choke housing in a self-compensated winding pattern for at least partially compensating a B1-excitation field of the magnetic resonance system.

6. The cable harness of claim 5, wherein the transmission lines each comprise a pair of a first coaxial cable and a second coaxial cable, wherein the first coaxial cable and the second coaxial cable are provided with an additional shield which is surrounding the first coaxial cable and the second coaxial cable and/or the first coaxial cable and the second coaxial cable are twisted around each other to form a twisted transmission line.

7. The cable harness of claim 1, wherein the chokes each comprise a choke housing which is made of a flexible foam material and/or a liquid-based material.

8. The cable harness of claim 1, wherein the radiofrequency chokes each comprise a shielding, and the shieldings are each arranged in proximity to the respective transmission line of the radio frequency choke and/or between two adjacent radio frequency chokes.

9. The cable harness of claim 1, wherein the choke housings have a toroid shape, a solenoid shape, a helical shape or a planar shape.

10. The magnetic resonance coil device for a magnetic resonance system, comprising:
- an array with multiple magnetic resonance receive coils, which are configured to receive a magnetic resonance radiofrequency signal,
- multiple individual connection lines and a connection terminal, wherein each of the magnetic resonance receive coils is connected to the connection terminal with one of the connection lines configured to transmit the magnetic resonance radiofrequency signals to the connection terminal,
- and
- the cable harness of claim 1,
- wherein the cable harness-comprises multiple transmission lines-which on one side are individually connected to a respective connection line-via the connection terminal- and on the other side are connected to the input-output unit for transmitting the individual magnetic resonance radiofrequency signals to an analysis and control unit of the magnetic resonance system via the input-output unit.

11. The magnetic resonance system with the analysis and control unit and the magnetic resonance coil device according to claim 10, which is connected to the analysis and control unit via the input-output unit-.

12. A cable harness configured for a magnetic resonance system, the cable harness comprising:
- at least one transmission line configured to connect an associated feeding point of a magnetic resonance radio frequency coil device to an input-output unit;
- a flexible support structure including multiple radiofrequency chokes that are flexibly connected to the support structure such that the radiofrequency chokes are at least one of rotatable or inclinable with respect to the support structure.

13. The cable harness of claim 12, further comprising multiple transmission lines for connecting the feeding point with the input-output unit, wherein the transmission lines each comprise at least one radiofrequency choke which is arranged within the cable harness.

14. The cable harness of claim 13, wherein the transmission lines each comprise a pair of a first coaxial cable and a second coaxial cable, wherein the first coaxial cable and the second coaxial cable are provided with an additional shield which is surrounding the first coaxial cable and the second coaxial cable and/or the first coaxial cable and the second coaxial cable are twisted around each other to form a twisted transmission line.

15. The cable harness of claim 12, wherein the radiofrequency chokes are arranged in the cable harness in an arrangement which extends along the longitudinal extension of the cable harness.

16. The cable harness of claim 15, wherein the radiofrequency chokes are arranged in the cable harness in series one after the other.

17. The cable harness of claim 12, wherein the radiofrequency chokes each comprise a choke housing, and wherein the cable harness comprises multiple transmission lines which are coaxial cables.

18. The cable harness of claim 12, wherein the chokes each comprise a choke housing which is made of a flexible foam material and/or a liquid-based material.

19. The cable harness of claim 12, wherein the radiofrequency chokes each comprise a shielding, and the shieldings are each arranged in proximity to the respective transmission line of the radio frequency choke and/or between two adjacent radio frequency chokes.

20. The cable harness of claim 12, wherein the choke housings have a toroid shape, a solenoid shape, a helical shape or a planar shape.

* * * * *